(12) United States Patent
Mori

(10) Patent No.: US 9,694,535 B2
(45) Date of Patent: Jul. 4, 2017

(54) IMPRINT APPARATUS AND ARTICLE MANUFACTURING METHOD USING SAME

(71) Applicant: CANON KABUSHIKI KAISHA, Tokyo (JP)

(72) Inventor: Sunao Mori, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 635 days.

(21) Appl. No.: 14/238,525

(22) PCT Filed: Sep. 18, 2012

(86) PCT No.: PCT/JP2012/005938
§ 371 (c)(1),
(2) Date: Feb. 12, 2014

(87) PCT Pub. No.: WO2013/042350
PCT Pub. Date: Mar. 28, 2013

(65) Prior Publication Data
US 2014/0191441 A1    Jul. 10, 2014

(30) Foreign Application Priority Data
Sep. 21, 2011   (JP) ................................ 2011-205432

(51) Int. Cl.
*B29C 59/00* (2006.01)
*B82Y 10/00* (2011.01)
(Continued)

(52) U.S. Cl.
CPC ............ *B29C 59/002* (2013.01); *B82Y 10/00* (2013.01); *B82Y 40/00* (2013.01); *G03F 7/0002* (2013.01);
(Continued)

(58) Field of Classification Search
CPC ............ B29C 2043/025; B29C 43/021; B29C 59/002; B29C 59/022; B29C 2059/023;
(Continued)

(56) References Cited

U.S. PATENT DOCUMENTS 5,997,963 A * 12/1999 Davison .................. C23C 16/44
                                                          118/722
7,019,819 B2 * 3/2006 Choi ...................... B29C 43/003
                                                          355/53

(Continued)

FOREIGN PATENT DOCUMENTS

| JP | 2004-103817 A | 4/2004 |
|---|---|---|
| JP | 2008-218976 A | 9/2008 |
| WO | 2011102240 A1 | 8/2011 |

OTHER PUBLICATIONS

International Search Report for PCT/JP2012/005938, dated Nov. 6, 2012.
(Continued)

*Primary Examiner* — Jeffrey Wollschlager
(74) *Attorney, Agent, or Firm* — Rossi, Kimms & McDowell LLP

(57) ABSTRACT

An imprint apparatus of the present invention molds an uncured resin on a substrate using a mold and cures the resin to thereby form a pattern of the cured resin on the substrate. The imprint apparatus includes a gas supply mechanism configured to supply gas from the mold side toward the substrate and to recover the supplied gas at the mold side, when the mold is pressed against the uncured resin; a substrate holding unit configured to be movable while holding the substrate and have a flat plate portion that has a surface height which is adjusted to the level of the surface of the held substrate and is disposed on the outside of the substrate so as to surround the substrate; and a gas recovery mechanism configured to recover the gas entrapped in a gap (Continued)

region which is present between the outer circumferential side of the substrate held by the substrate holding unit and the inner circumferential side of the flat plate portion toward the substrate.

10 Claims, 8 Drawing Sheets

(51) Int. Cl.
- *B82Y 40/00* (2011.01)
- *G03F 7/00* (2006.01)
- *B29C 59/02* (2006.01)
- *B29C 43/02* (2006.01)
- *B29C 33/42* (2006.01)

(52) U.S. Cl.
CPC .......... *B29C 33/424* (2013.01); *B29C 43/021* (2013.01); *B29C 59/022* (2013.01); *B29C 2033/426* (2013.01); *B29C 2043/025* (2013.01); *B29C 2059/023* (2013.01)

(58) Field of Classification Search
CPC . B29C 33/424; B29C 2033/426; B82Y 40/00; B82Y 10/00; G03F 7/0002
See application file for complete search history.

(56) References Cited

U.S. PATENT DOCUMENTS

| | | | | |
|---|---|---|---|---|
| 7,090,716 | B2* | 8/2006 | McMackin | B82Y 10/00 264/102 |
| 7,462,028 | B2* | 12/2008 | Cherala | B29C 43/003 425/385 |
| 7,670,534 | B2* | 3/2010 | Choi | B29C 43/003 264/293 |
| 7,755,740 | B2* | 7/2010 | Tsukamoto | G03F 7/70341 355/30 |
| 9,370,875 | B2* | 6/2016 | Hoshino | B29C 33/424 |
| 2006/0280829 | A1* | 12/2006 | Kruijt-Stegeman | B82Y 10/00 425/385 |
| 2007/0228589 | A1* | 10/2007 | Choi | B82Y 10/00 264/39 |
| 2008/0111984 | A1* | 5/2008 | Shibuta | G03F 7/70341 355/72 |
| 2008/0164638 | A1* | 7/2008 | Zhang | B29C 33/46 264/500 |
| 2009/0026658 | A1* | 1/2009 | Hosoda | B29C 59/022 264/319 |
| 2009/0061035 | A1* | 3/2009 | Cho | B82Y 10/00 425/174.4 |
| 2009/0267267 | A1* | 10/2009 | Yoneda | B29C 37/0053 264/293 |
| 2010/0096764 | A1* | 4/2010 | Lu | B82Y 10/00 264/39 |
| 2010/0164146 | A1* | 7/2010 | Furutono | B29C 37/0003 264/446 |
| 2010/0189836 | A1* | 7/2010 | Washiya | B29C 43/021 425/112 |
| 2011/0018167 | A1* | 1/2011 | Koole | B82Y 10/00 264/293 |
| 2011/0024948 | A1* | 2/2011 | Takaya | B29C 59/022 264/293 |
| 2011/0180964 | A1* | 7/2011 | Choi | B82Y 10/00 264/293 |
| 2011/0193251 | A1* | 8/2011 | Jain | B82Y 10/00 264/39 |
| 2011/0236579 | A1* | 9/2011 | Sato | B82Y 10/00 427/277 |
| 2012/0086149 | A1* | 4/2012 | Yoshida | B82Y 10/00 264/293 |
| 2012/0199997 | A1* | 8/2012 | Tanabe | B82Y 10/00 264/82 |
| 2012/0244719 | A1* | 9/2012 | Hatano | G03F 7/0002 438/759 |
| 2012/0306122 | A1 | 12/2012 | Hoshino | |

OTHER PUBLICATIONS

Hiroshima, Hiroshi; "Release force reduction in UV nanoimprint by mold orientation control and by gas environment"; IEEE Xplore Digital Library, IEEE Standards, IEEE Spectrum. English Abstract for article published in Journal of Vacuum Science & Technology B: Microelectronics and Nanometer Structures; vol. 27, Issue 6, pp. 2862-2865 (Nov. 2009).

* cited by examiner

IMPRINT APPARATUS AND ARTICLE MANUFACTURING METHOD USING SAME

This application is a U. S. National Phase Application of PCT International Application PCT/JP2012/005938 filed on Sep. 18, 2012, which is based on and claims priority from JP 2011-205432 filed on Sep. 21, 2011, the contents of which is incorporated in its entirety by reference.

TECHNICAL FIELD

The present invention relates to an imprint apparatus and an article manufacturing method using the same.

BACKGROUND ART

As the demand for microfabrication of semiconductor devices or MEMS increases, not only a conventional photolithography technology but also a microfabrication technology in which an uncured resin on a substrate is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint material, photocurable resin) to a shot area (imprint area) on a substrate (wafer). Next, the resin (uncured resin) is molded by a mold. After the ultraviolet curable resin is irradiated with ultraviolet light for curing, the cured resin is released from the mold, whereby a resin pattern is formed on the substrate.

In the imprint apparatus employing the technology, it is preferable that an uncured resin is advantageously filled in a fine concave and convex pattern formed in a mold upon pressing the mold against the resin on a substrate, whereas a releasing force is reduced as much as possible upon releasing the mold from the cured resin. In contrast, Non-Patent Literature 1 discloses a method for supplying a specific gas (pentafluoropropane) to a gap between the mold and the resin on the wafer during imprint processing to thereby achieve improvement in filling property and mold-release property described above. However, Non-Patent Literature 1 does not take into account imprint processing for the region of the end of the wafer. For example, in a series of manufacturing steps of manufacturing a semiconductor device, if a resin pattern is not always formed up to a portion that extends to the same distance from the end of the substrate, the entire substrate cannot be subjected to uniform processing in the subsequent manufacturing steps, resulting in a reduction in the yield of devices on the entire substrate. Likewise, a reduction in the yield of devices occurs in the manufacturing steps using an exposure apparatus. Here, Patent Literature 1 discloses an immersion exposure apparatus in which a coplanar plate with a height (surface height) equivalent to the level of the surface of a wafer is disposed on the outside of the wafer placed on a wafer stage. Also in the immersion exposure apparatus, differences may occur between devices manufactured at the end of the wafer and the central portion thereof due to the entrapment of air bubbles from the gap between the end of the wafer and the coplanar plate, resulting in a reduction in the yield of devices on the entire wafer. Accordingly, in the immersion exposure apparatus disclosed in Patent Literature 1, water is actively supplied into the gap so as to suppress the entrapment of air bubbles. Consequently, uniform devices are formed even at the end of the wafer, and thus, a reduction in yield is suppressed.

CITATION LIST

Patent Literature
PTL 1: Patent Literature 1: Japanese Patent Laid-Open No. 2008-218976
Non-Patent Literature
NPL 1: Non-Patent Literature 1: Hiroshi Hiroshima, "Release force reduction in UV nano imprint by mold orientation control and by gas environment", JOURNAL OF VACUUM SCIENCE & TECHNOLOGY, November/December 2009, B27 (6), P. 2862-2865

However, it is difficult to apply the configuration of the immersion exposure apparatus disclosed in Patent Literature 1 to the imprint apparatus employing the method disclosed in Non-Patent Literature 1 without modifications. This is because pentafluoropropane, which is the gas disclosed in Non-Patent Literature 1, is gaseous under standard temperature and pressure conditions, and thus, is transmitted along the gap between the wafer and the coplanar plate disposed outside the wafer, resulting in leakage into other spaces within the imprint apparatus. Leakage of pentafluoropropane having a high global warming potential is not preferred, and thus, it is desired that the entire amount of pentafluoropropane be recovered each time. Here, it is also contemplated that gas other than pentafluoropropane may be employed for the imprint apparatus as described above if both filling property and mold-release property are taken into account. Examples of gas employable herein include another fluorine gas, gas consisting of a resin solvent for reducing the viscosity of a resin; and the like. Likewise, it is desired that the entire amount of such gas be recovered from the viewpoint of a global warming potential, environmental maintenance in an imprint apparatus, a safeguard against explosion in the case of employing flammable gas, and the like.

SUMMARY OF INVENTION

The present invention provides an imprint apparatus that is advantageous for improving the uniformity of processing for the entire substrate even when using gas which is useful for the filling property and the mold-release property of the resin with respect to the mold.

According to an aspect of the present invention, an imprint apparatus that molds an uncured resin on a substrate using a mold and cures the resin to thereby form a pattern of the cured resin on the substrate is provided that includes a gas supply mechanism configured to supply gas from the mold side toward the substrate and to recover the supplied gas at the mold side, when the mold is pressed against the uncured resin; a substrate holding unit configured to be movable while holding the substrate and have a flat plate portion that has a surface height which is adjusted to the level of the surface of the held substrate and is disposed on the outside of the substrate holding unit so as to surround the substrate; and a gas recovery mechanism configured to recover the gas entrapped in a gap region which is present between the outer circumferential side of the substrate held by the substrate holding unit and the inner circumferential side of the flat plate portion toward the substrate.

According to the present invention, an imprint apparatus that is advantageous for improving uniformity of processing for the entire substrate even when using gas which is useful for the filling property and the mold-release property of the resin with respect to the mold may be provided.

Further features of the present invention will become apparent from the following description of exemplary embodiments with reference to the attached drawings.

DESCRIPTION OF EMBODIMENTS

Hereinafter, the preferred embodiments of the present invention will now be described with reference to the accompanying drawings.

Figure 1:
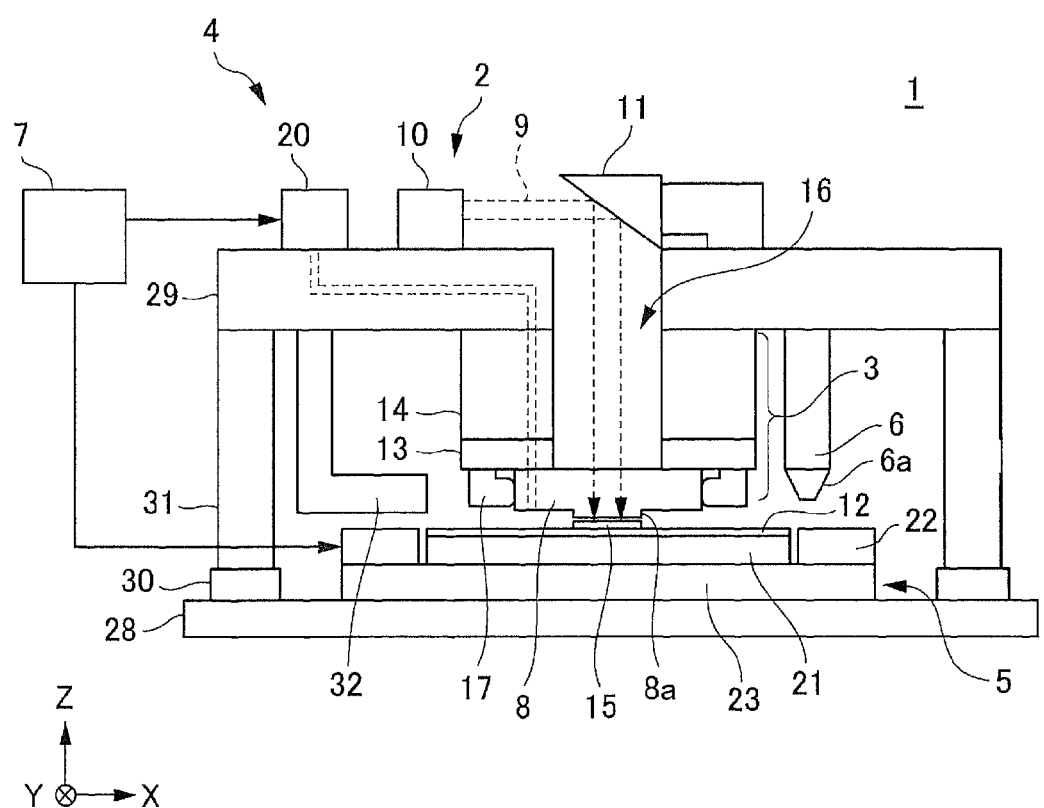
FIG. 1 is a diagram illustrating the configuration of an imprint apparatus according to one embodiment of the present invention.

Firstly, a description will be given of an imprint apparatus according to one embodiment of the present invention. FIG. 1 is a schematic diagram illustrating the configuration of an imprint apparatus 1 according to the present embodiment. The imprint apparatus 1 is an apparatus that molds an uncured resin on a wafer (on a substrate), i.e., a substrate to be treated, using a mold to thereby form a resin pattern on the wafer, which is used in the manufacture of devices such as semiconductor devices and the like as articles. Note that the imprint apparatus of the present embodiment is an apparatus employing a photo-curing method. In the following drawings, a description will be given where the Z axis is aligned parallel to the optical axis of an irradiation system that irradiates ultraviolet light onto a resin on a wafer, and mutually orthogonal axes X and Y are aligned in the direction in a plane perpendicular to the Z axis. Firstly, the imprint apparatus 1 includes a light irradiation unit 2, a mold holding mechanism 3, a gas supply mechanism 4, a wafer stage 5, an application unit 6, and a control unit 7.

The light irradiation unit 2 irradiates a mold 8 with ultraviolet light 9 during imprint processing. The light irradiation unit 2 is constituted by a light source 10 and an optical element 11 that adjusts the ultraviolet light 9 emitted from the light source 10 to light suitable for imprinting. Note that, in the present embodiment, the light irradiation unit 2 is installed for employing a photo-curing method. For example, if a thermosetting method is employed, a heat source unit for curing a thermosetting resin may be installed instead of the light irradiation unit 2.

The outer peripheral shape of the mold 8 is rectangular and the mold 8 includes a pattern section (e.g., a convex portion having a fine concave and convex pattern of a circuit pattern or the like to be transferred on the surface thereof) 8a which is three-dimensionally formed on the surface opposed to a wafer 12. Also, the material of the mold 8 is a material such as quartz or the like through which the ultraviolet light 9 can pass. Furthermore, for ease of deformation as described below, the mold 8 may be of a shape in which a cavity (concave portion) of a circular planer shape having a certain depth is formed on the surface on which the ultraviolet light 9 is irradiated.

Firstly, the mold holding mechanism 3 has a mold chuck 13 that holds the mold 8 and a mold drive mechanism 14 that holds the mold chuck 13 and moves the mold 8 (the mold chuck 13). The mold chuck 13 may hold the mold 8 by suctioning/attracting the outer peripheral region of the surface of the mold 8 irradiated with the ultraviolet light 9 using a vacuum suction force/an electrostatic force. For example, if the mold chuck 13 holds the mold 8 using a vacuum suction force, the mold chuck 13 is connected to an externally installed vacuum pump (not shown), and attachment/detachment of the mold 8 is switched by turning the vacuum pump ON/OFF. The mold drive mechanism 14 moves the mold 8 in the Z-axis direction so as to selectively press the mold 8 against a resin 15 on the wafer 12 or release the mold 8 from the resin 15. Examples of an actuator employable for the mold drive mechanism 14 include a linear motor, an air cylinder, and the like. Also, the mold drive mechanism 14 may be constituted by a plurality of drive systems such as a coarse movement drive system, a fine movement drive system, and the like in order to accommodate positioning of the mold 8 with high accuracy. Furthermore, the mold drive mechanism 14 may have a position adjustment function for adjusting the position of the mold 8 not only in the Z-axis direction but also in the X-axis direction, the Y-axis direction, or the theta (rotation about the Z axis) direction, a tilt function for correcting the tilt of the mold 8, and the like. Note that the pressing operation and the releasing operation performed by the imprint apparatus 1 may be realized by moving the mold 8 in the Z-axis direction, may be realized by moving the wafer stage 5 in the Z-axis direction, or may also be realized by moving both the mold 8 and the wafer stage 5 relative to each other.

Also, each of the mold chuck 13 and the mold drive mechanism 14 has an aperture region 16 at the central portion (the inside thereof) such that the ultraviolet light 9 emitted from the light irradiation unit 2 is irradiated toward the wafer 12. A light transmission member (e.g. glass plate) (not shown) is installed within the aperture region 16 such that a space circumscribed by a part of the aperture region 16 and the mold 8 is sealed, and the pressure in the space is adjusted by a pressure adjusting device including a vacuum pump or the like. The pressure adjusting device sets the pressure in the space higher than the external pressure during the pressing operation so that a pattern section 8a is deflected toward the wafer 12 in a convex shape and the pattern section 8a is brought into contact with the resin 15 from the central portion of the pattern section 8a. With this arrangement, gas (air) is prevented from being entrapped between the pattern section 8a and the resin 15 so that the resin 15 can be filled in the every corner of the convex and concave pattern of the pattern section 8a. Furthermore, the mold holding mechanism 3 has a magnification correction mechanism 17 that corrects the shape of the mold 8 (the pattern section 8a) by imparting an external force or displacement to the side surface of the mold 8. The magnification correction mechanism 17 is installed at the mold 8 holding side of the mold chuck 13.

Figure 2:
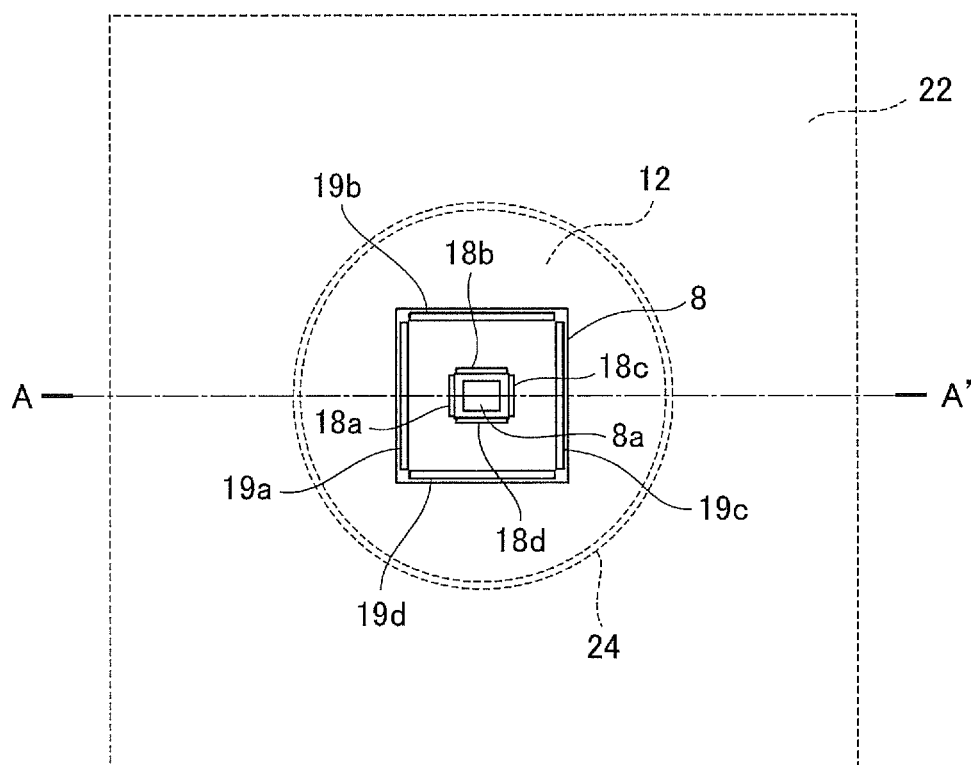
FIG. 2 is a diagram illustrating the surface of a mold as viewed from the wafer stage side.
Figure 2:
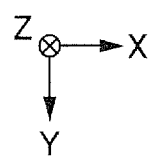

From the viewpoint of the filling property, in order to reduce the time required for filling the resin 15 into the concave and convex pattern of the pattern section 8a and prevent air bubbles from being retained in the filled resin 15, the gas supply mechanism 4 supplies gas into the gap between the mold 8 and the wafer 12 during the pressing operation. From the viewpoint of mold-release property for reducing a releasing force as much as possible, the gas supply mechanism 4 also supplies gas during the releasing operation. FIG. 2 is a schematic plan view illustrating the surface of the mold 8 as viewed from the wafer stage 5 side. In FIG. 2, the wafer 12 and the coplanar plate 22 on the wafer stage 5 (to be described below) corresponding to the position of the mold 8 are shown by the dotted lines. Firstly, the gas supply mechanism 4 has a plurality of supply ports 18 that supply (discharge) gas to the wafer 12 placed on the wafer stage 5 and a plurality of recovery ports 19 that recover the gas supplied from the supply ports 18. Also, the gas supply mechanism 4 includes a gas control unit 20 that is connected to each of the supply ports 18 and the recovery ports 19 and controls the supply/recovery of gas while adjusting a supply amount of gas as appropriate. The supply ports 18 (18a, 18b, 18c, and 18d) are disposed on four sides of the outer circumferential region of the pattern section 8a formed in the mold 8 as shown in FIG. 2. On the other hand, the recovery ports 19 (19a, 19b, 19c, and 19d) are disposed adjacent to four sides of the mold 8 as shown in FIG. 2. Here, in order to avoid contact between the discharge surfaces of the supply ports 18 and the resin 15 on the wafer 12 during the pressing operation, the height of each of the gas discharge surfaces of the supply ports 18 is set to be equivalent to the level of the surface of the mold 8 facing toward the wafer 12. From the above viewpoint, a preferred example of gas to be supplied by the gas supply mechanism 4 includes pentafluoropropane or the like.

The wafer 12 is, for example, a single crystal silicon substrate or a SOI (Silicon on Insulator) substrate, and an ultraviolet curable resin (hereinafter referred to as "resin") 15, which is molded by the pattern section 8a formed in the mold 8, is applied on the treatment surface of the wafer 12.

Figure 3A:
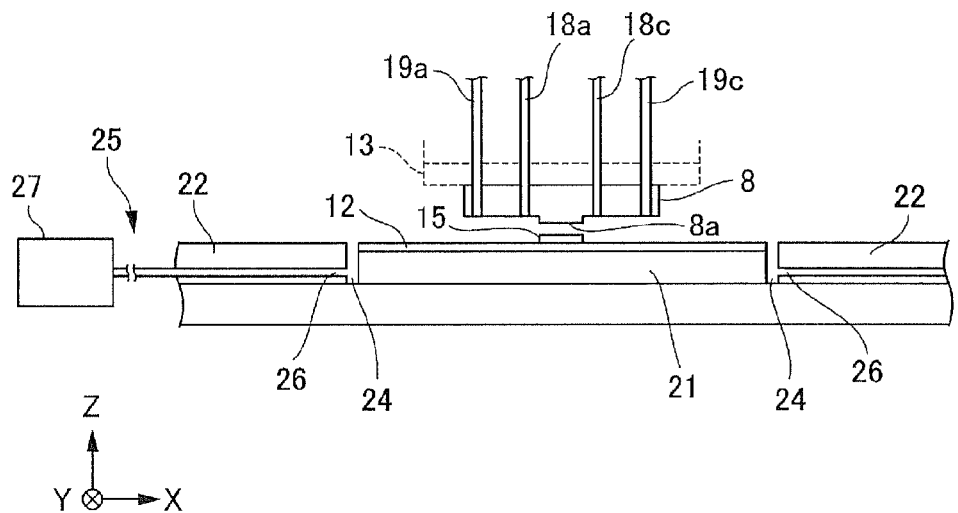
FIGS. 3A and 3B are diagrams illustrating the configuration of a coplanar plate on a wafer stage.
Figure 3B:
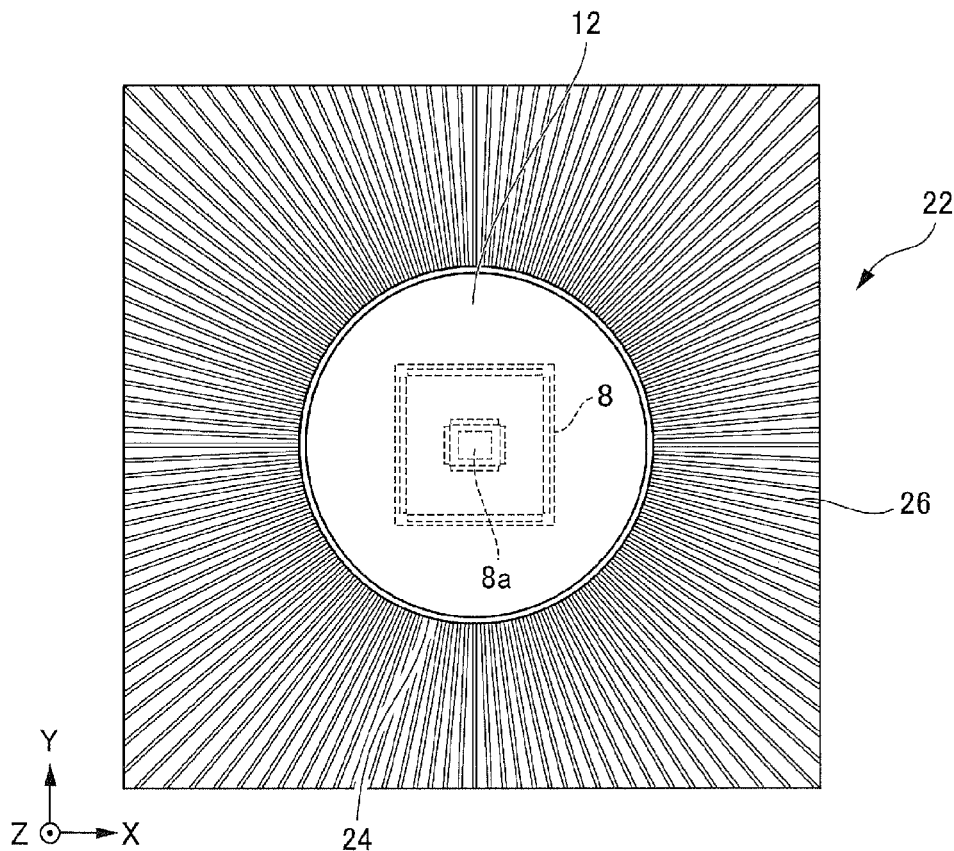
Figure 4:
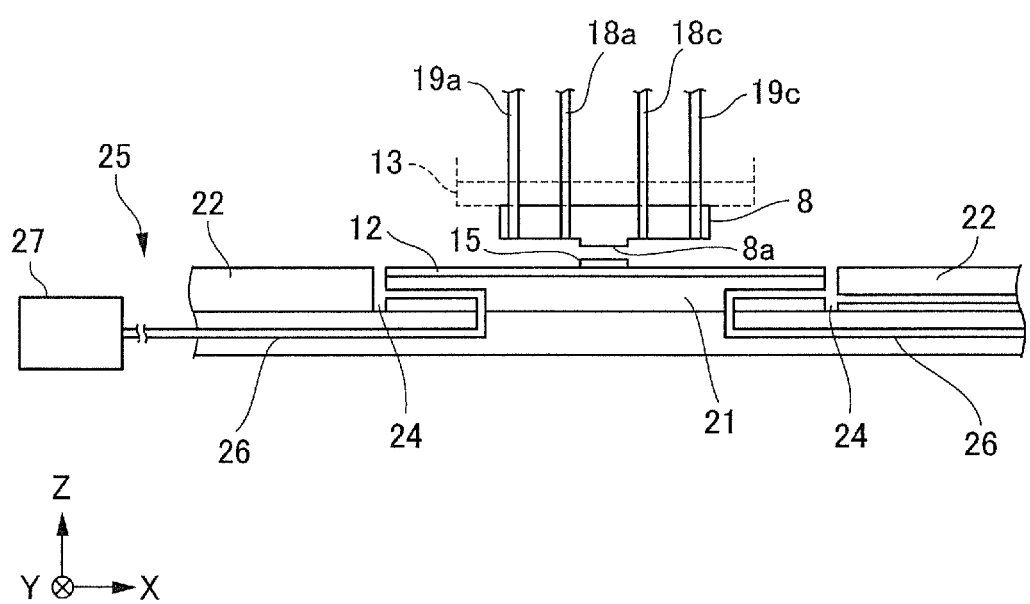
FIG. 4 is a diagram illustrating another exemplary configuration of a recovery pipe of a gas recovery mechanism.

The wafer stage (substrate holding unit) 5 holds the wafer 12 and executes position matching between the mold 8 and the resin 15 during the pressing operation. The wafer stage 5 has a wafer chuck 21 that holds the wafer 12 by a suction force and a coplanar plate 22 that has a surface height equivalent to the level of the surface of the wafer 12 and is disposed on the outside (in the vicinity of the outer circumference) of the wafer 12. Furthermore, the wafer stage 5 has a stage drive mechanism 23 that holds the wafer chuck 21 by a mechanical unit and is movable in each axis direction. FIGS. 3A and 3B are schematic diagrams illustrating the configuration of the coplanar plate 22 on the wafer stage 5. In particular, FIG. 3A is a cross-sectional view illustrating the configuration of the coplanar plate 22 on the wafer stage 5 including the configuration of the mold 8 along section line A-A' shown in FIG. 2. The coplanar plate (flat plate portion) 22 maintains the filling of supply gas to the gap space between the pattern section 8a and the wafer 12 when imprint processing is performed for a shot region lying on a position away from the center of the wafer 12 as the subject for processing. Here, the outer diameter of the wafer 12 fluctuates depending on each production lot. In order to accommodate such fluctuations, the inner diameter of the opening of the coplanar plate 22 facing the outer circumferential side of the wafer 12 is normally greater than the maximum outer diameter of the wafer 12. Thus, a gap region 24 is present between the outer circumferential side of the wafer 12 and the inner circumferential side (opening side) of the coplanar plate 22. Accordingly, the imprint apparatus 1 includes a gas recovery mechanism 25 that is capable of recovering gas which is present in the gap region 24. In the example shown in FIG. 3A, the gas recovery mechanism 25 has a plurality of recovery pipes 26 provided internally in the coplanar plate 22 such that the suction ports face the gap region 24. FIG. 3B is a plan view illustrating the arrangement of the plurality of recovery pipes 26 provided internally in the coplanar plate 22. As shown in FIG. 3B, the plurality of recovery pipes 26 are radially arranged so as to be oriented in a circumferential direction from the center position where the wafer 12 is held. These recovery pipes 26 are independently connected to a gas recovery unit 27 constituting the gas recovery mechanism 25, and the gas recovery unit 27 independently recovers gas from the recovery pipes 26. Note that the plurality of recovery pipes 26 is not necessarily be directed toward the gap region 24 from the coplanar plate 22 as shown in FIG. 3. As shown in FIG. 4, the suction ports of the recovery pipes 26 may also be directed toward the gap region 24 from the wafer chuck 21 side.

Examples of an actuator employable for the stage drive mechanism 23 include a linear motor. The stage drive mechanism 23 may also be constituted by a plurality of drive systems such as a coarse movement drive system, a fine movement drive system, and the like with respect to the X-axis and Y-axis directions. Furthermore, the stage drive mechanism 23 may have a drive system for adjusting the position of the wafer 12 in the Z-axis direction, a position adjustment function for adjusting the position of the wafer 12 in the theta direction, a tilt function for correcting the tilt of the wafer 12, and the like. Also, the wafer stage 5 has a reference mark (not shown) that is used when the mold 8 is subjected to alignment on the surface thereof.

The application unit 6 is installed near the mold holding mechanism 3 and applies the resin (uncured resin) 15 to the wafer 12. Here, the resin 15 is a photocurable resin (imprint material) having the property of being cured by receiving irradiation of the ultraviolet light 9, and is appropriately selected depending on various conditions such as the manufacturing process of semiconductor devices or the like. The amount of the resin 15 to be ejected from the ejection nozzle 6a of the application unit 6 is also appropriately determined by a desired thickness of the resin 15 to be formed on the wafer 12, the density of the pattern to be formed, or the like.

The control unit 7 may control the operation, adjustment, and the like of the components of the imprint apparatus 1. The control unit 7 is constituted by a computer or the like and is connected to the components of the imprint apparatus 1 through a line so as to execute control of the components by a program or the like. In particular, the control unit 7 of the present embodiment may control at least the gas supply mechanism 4 and the gas recovery mechanism 25. Note that the control unit 7 may be integrated with the rest of the imprint apparatus 1 (provided in a common housing) or may be provided separately from the rest of the imprint apparatus 1 (provided in a separate housing).

Also, the imprint apparatus 1 includes an alignment measurement system (not shown) that measures a positional shift between an alignment mark formed on the wafer 12 and an alignment mark formed on the mold 8 in each direction of X-axis and Y-axis as wafer alignment. The control unit 7 calculates the pressing position (coordinates) based on the measurement result obtained by the alignment measurement system. In addition, the imprint apparatus 1 includes a base surface plate 28 on which the wafer stage 5 is placed, a bridge surface plate 29 that fixes the mold holding mechanism 3, and a strut 31 that is extended from the base surface plate 28 and supports the bridge surface plate 29 via a vibration isolator 30. The vibration isolator 30 removes the vibration transmitted from the floor to the bridge surface plate 29. Furthermore, the imprint apparatus 1 includes a mold conveyance mechanism (not shown) that conveys the mold 8 from the exterior of the apparatus to the mold holding mechanism 3 and a substrate conveyance mechanism 32 that conveys the wafer 12 from the exterior of the apparatus to the wafer stage 5.

Next, a description will be given of imprint processing performed by the imprint apparatus 1. Firstly, the control unit 7 causes the mold conveyance mechanism to convey the mold 8 to the mold chuck 13 and places the mold 8 on the mold chuck 13. Next, the control unit 7 causes the alignment measurement system to measure a positional shift between a reference mark formed on the wafer stage 5 and an alignment mark formed on the mold 8 in each direction of X-axis, Y-axis, and theta. Here, the control unit 7 executes position matching between the reference mark and the alignment mark formed on the mold 8 based on the measurement result as mold alignment. Next, the control unit 7 places and fixes the wafer 12 on the wafer chuck 21 of the wafer stage 5 using the substrate conveyance mechanism 32, and then moves the wafer stage 5 to the application position of the application unit 6. Next, as an application step, the application unit 6 applies the resin 15 to a shot region to be processed on the wafer 12. Next, the control unit 7 executes wafer alignment by moving the wafer stage 5 such that the shot region is placed in a position directly below the pattern section 8a formed in the mold 8. Next, the control unit 7 drives the mold drive mechanism 14 so as to press the mold 8 against the resin 15 on the wafer 12 (mold-pressing step). At this time, the control unit 7 executes determination whether or not the pressing operation has been completed, by a load sensor (not shown) provided internally in the mold holding mechanism 3. During the mold-pressing step, the resin 15 is filled in the convex and concave pattern of the pattern section 8a. Under this condition, as a curing step, the control unit 7 causes the light irradiation unit 2 to emit the ultraviolet light 9 from the top surface of the mold 8, and the resin 15 is cured by the ultraviolet light 9 that has been transmitted through the mold 8. Then, after the resin 15 is cured, the control unit 7 drives the mold drive mechanism 14 again to thereby release the mold 8 from the resin 15 (mold-releasing step). By the aforementioned steps, a three dimensionally shaped pattern (layer) of the resin 15 following the convex and concave pattern of the pattern section 8a is formed on the surface of the shot region on the wafer 12. Such a sequence of imprint operations is conducted two or more times while the shot region is changed under the drive of the wafer stage 5 to thereby be able to form a plurality of patterns of the resin 15 on one wafer 12.

Figure 7A:
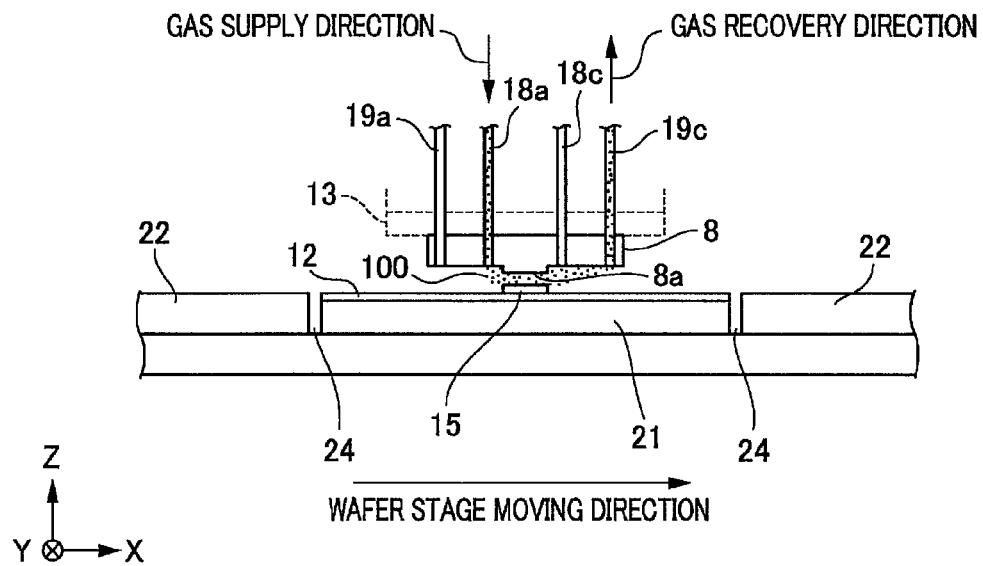
FIGS. 7A and 7B are diagrams illustrating how the conventional gas supply mechanism supplies and recovers gas.
Figure 7B:
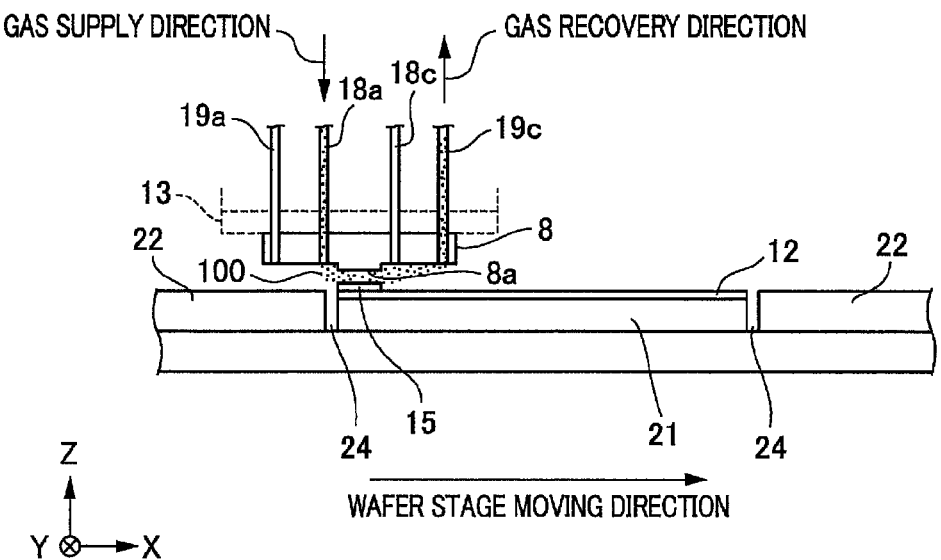

Here, immediately before the pressing operation in at least the mold-pressing step described above, the control unit 7 causes the gas supply mechanism 4 to execute the supply/recovery of gas to/from the gap between the mold 8 and the wafer 12. Here, the reason why the supply/recovery of gas are executed is because external leakage of pentafluoropropane, which is employed as supply gas, having a high global warming potential is not preferred and pentafluoropropane is re-purified for reuse after recovery. Firstly, as a comparison with the present embodiment, a description will be given of the supply/recovery of gas to/from the gap between the mold and the wafer using the conventional imprint apparatus. FIGS. 7A and 7B are schematic diagrams illustrating how the conventional imprint apparatus supplies and recovers gas. In FIGS. 7A and 7B, the same components as those of the imprint apparatus of the present embodiment are designated by the same reference numerals for ease of explanation. Firstly, FIG. 7A is a cross-sectional view illustrating how gas is supplied and recovered when a shot region to be processed is present on the central portion of the wafer 12. At this time, the control unit 7 causes the stage drive mechanism 23 to move the wafer 12 with respect to the mold 8 from the minus direction to the plus direction of the X-axis and causes the gas supply mechanism 4 to supply a gas 100 from the supply port 18a toward the wafer 12. The supplied gas 100 passes the vicinity of the surface of the pattern section 8a while being dragged by the moving wafer 12, and is recovered by the recovery port 19c opposite to the supply port 18a with reference to the pattern section 8a. Specifically, since the supplied gas 100 in this case does not pass through the gap region 24, the supplied gas 100 does not stagnate in the gap region 24. Consequently, the gas 100 does not readily leaks out from the vicinity of the wafer 12.

On the other hand, FIG. 7B is a cross-sectional view illustrating how gas is supplied and recovered when a shot region to be processed is present on the end of the wafer 12. At this time, when the control unit 7 causes the gas supply mechanism 4 to perform the same operation as that shown in FIG. 7A in the vicinity of the end of the wafer 12, the gas 100 enters into the interior of the gap region 24. Thus, the gas 100 entrapped in the gap region 24 passes along the circumferential shape of the gap region 24, which makes it difficult to recover the gas 100 by the recovery ports 19. Consequently, the gas 100 leaks out from the vicinity of the wafer 12. Accordingly, in the imprint apparatus 1 of the present embodiment, the gas recovery mechanism 25 recovers the gas entrapped in the gap region 24 so as to prevent leakage of the gas 100 from the vicinity of the wafer 12.

Figure 5:
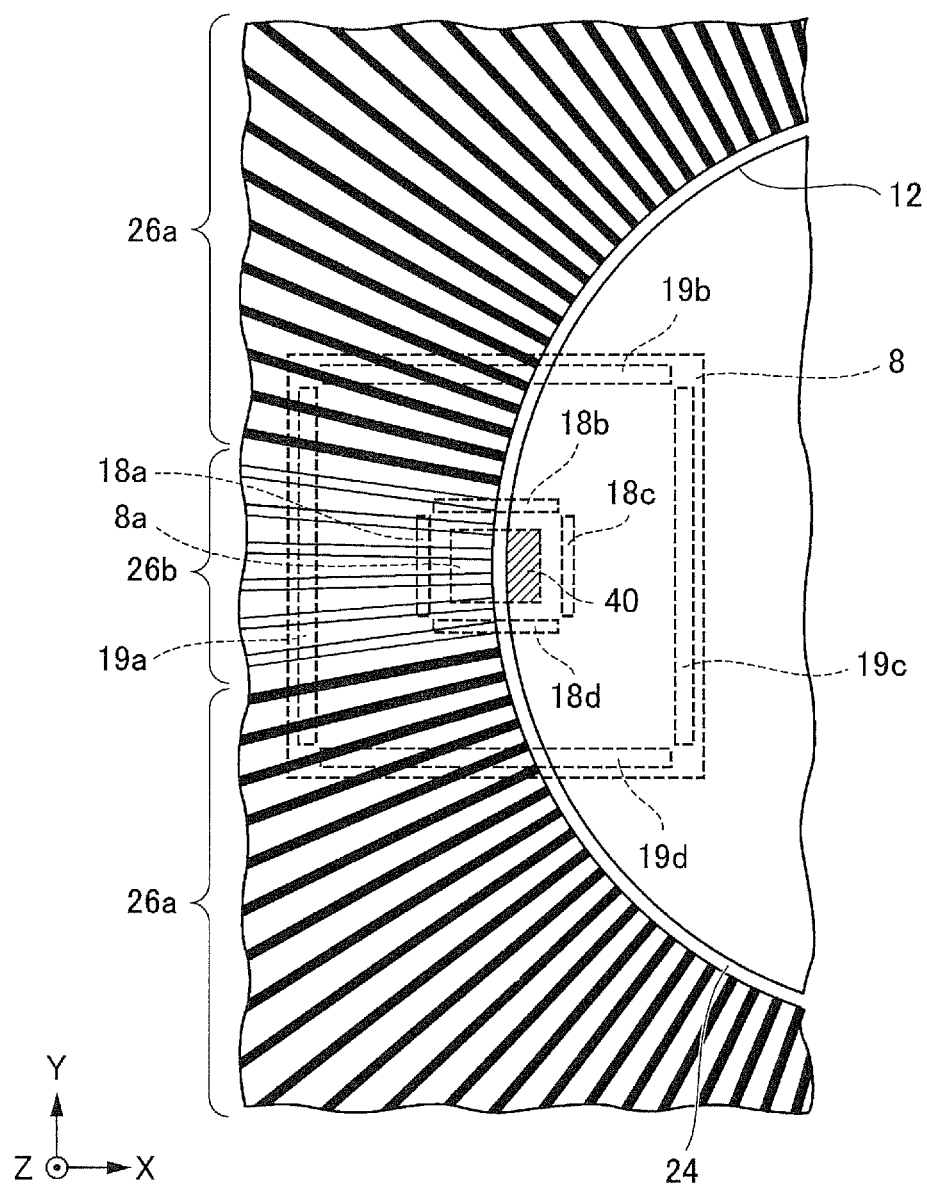
FIG. 5 is a diagram illustrating a state in which a gas recovery mechanism recovers gas in a gap region.

FIG. 5 is a schematic plan view illustrating a state in which the gas recovery mechanism 25 of the present embodiment recovers gas present in the gap region 24 when imprint processing is performed for a shot region 40 which is located at the end of the wafer 12. In FIG. 5, a part of a plurality of recovery pipes 26 provided within the coplanar plate 22 that is located in the vicinity of the shot region 40 is shown, where among the recovery pipes 26, the recovery pipes 26a performing the recovery (discharge) operation are shown by black rectangles and the recovery pipes 26a not performing the recovery (discharge) operation are shown by white rectangles. When the gas supply mechanism 4 starts the supply of gas at the position of the wafer 12, gas enters into the interior of the gap region 24 as described above. Thus, the control unit 7 causes the gas recovery mechanism 25 to recover the gas, which is present in the interior of the gap region 24, from the recovery pipes 26, so that leakage of the gas can be suppressed. In contrast, if the gas recovery mechanism 25 performs the recovery operation using all of the recovery pipes 26, gas present in the vicinity of the shot region 40 is also recovered, whereby the advantage of an improvement in filling property and mold-release property may not be obtained. Accordingly, in the present embodiment, when the control unit 7 causes the gas recovery mechanism 25 to recover the gas at the end of the wafer 12, the recovery pipes 26b of which the suction ports are located in the vicinity of the shot region 40 refrain from performing the recovery operation as shown in FIG. 5. In this case, the control unit 7 may determine the recovery pipes 26b not to be operated as those of which the suction ports are present between two supply ports 18*b* and 18*d*, which are located opposite to the gap region 24, of the gas supply mechanism 4. In this manner, in the imprint apparatus 1, the gas recovery mechanism 25 is operated as described above in synchronism with the operation of the gas supply mechanism 4, and thus, leakage of the supplied gas can be suppressed without degrading the filling property and mold-release property of the resin 15 with respect to the mold 8.

Figure 6A:
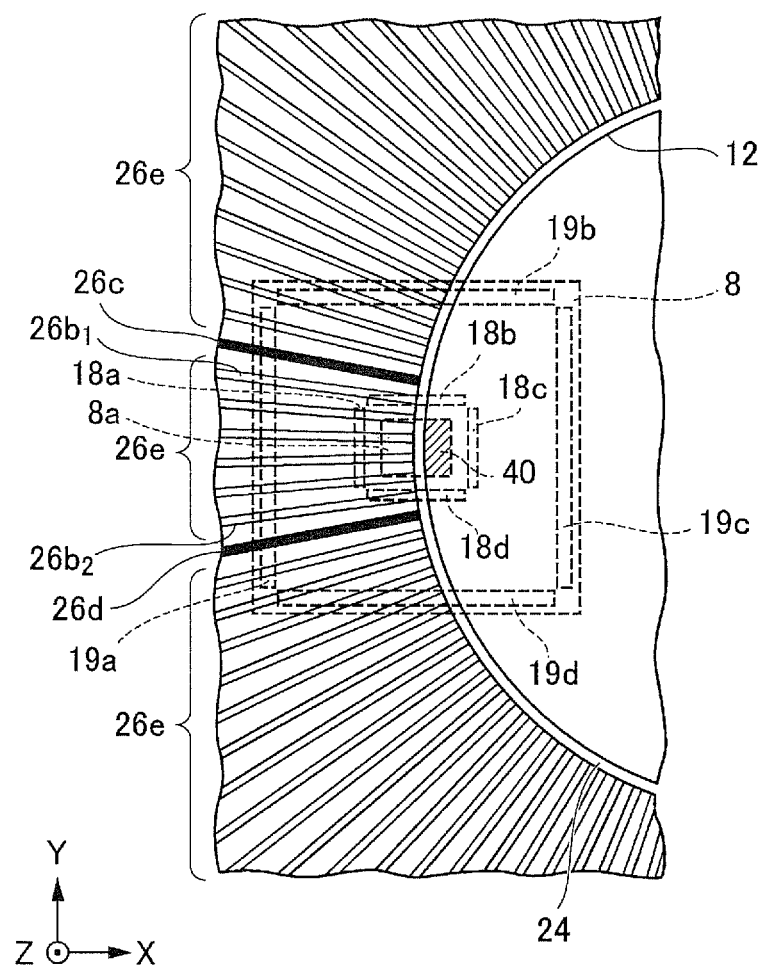
FIGS. 6A and 6B are diagrams illustrating another state in which a gas recovery mechanism recovers gas in a gap region.
Figure 6B:
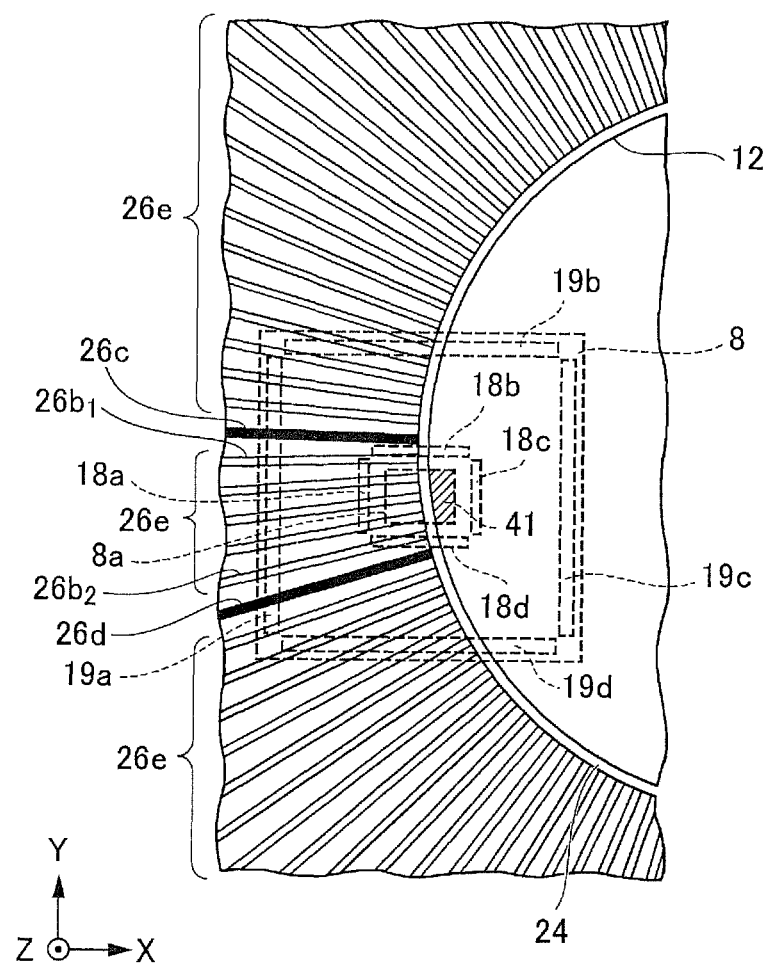

Note that the method for recovering gas present in the gap region 24 when imprint processing is performed for the shot region 40 which is located at the end of the wafer 12 is not limited to the method described above. For example, the number of recovery pipes 26*a* which perform the recovery operation as shown in FIG. 5 can further be reduced. FIGS. 6A and 6B correspond to FIG. 5 and are schematic plan views illustrating a state in which the number of recovery pipes 26*a* that perform the recovery operation has been reduced. Firstly, as in the state shown in FIG. 5, the control unit 7 determines the recovery pipes 26*b* not to be operated as those for which the suction ports are present between two supply ports 18*b* and 18*d*, which are located opposite to the gap region 24, of the gas supply mechanism 4. Then, the control unit 7 causes only two recovery pipes 26*c* and 26*d*, which are disposed adjacent to two recovery pipes $26b_1$ and $26b_2$ located at the outermost end of the recovery pipes 26*b* not to be operated, to perform the recovery operation and does not cause all of the recovery pipes 26*e* other than the recovery pipes 26*c* and 26*d* to perform the recovery operation as shown in FIG. 6A. Here, pentafluoropropane, which is employed as supply gas, is mixed with ambient gas (air) under lean mixture conditions when being recovered. Specifically, in order to repeatedly use pentafluoropropane in the imprint apparatus 1 after the recovery and re-purification, it is preferable that pentafluoropropane is recovered at a high concentration so as to avoid an increase in size of a separately provided purification device. Pentafluoropropane can be recovered at high concentration by controlling the operation of the recovery pipes 26 as shown in FIGS. 6A and 6B. It is also contemplated that a shot region shifts from the shot region 40 which is located at the end of the wafer 12 to a shot region 41 (see FIG. 6B) to be processed during the next imprint processing. In this case, the control unit 7 can handle such situation by simply executing a sequence of switching the two recovery pipes 26*c* and 26*d* which perform the recovery operation in accordance with the position of the shot region 41 as shown in FIG. 6B.

In this manner, the imprint apparatus 1 can perform uniform imprint processing when a shot region to be processed is present on any position of the wafer 12 because the imprint apparatus 1 has the coplanar plate 22 on the wafer stage 5. At this time, even if gas such as pentafluoropropane is used, leakage of gas from the gap region 24 can be suppressed without losing the advantages with regard to the filling property and the mold-release property of the resin 15 with respect to the mold 8. At the same time, gas can be preferably recovered from the gap region 24, which may also be advantageous for re-purification and reuse of gas after recovery.

As described above, according to the present embodiment, the imprint apparatus 1 that is advantageous for improving the uniformity of imprint processing for the entire wafer 12 even when using gas that is useful for the filling property and the mold-release property of the resin 15 with respect to the mold 8 may be provided.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include other steps of processing the substrate on which a pattern has been formed instead of the etching step. The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-205432 filed Sep. 21, 2011 which is hereby incorporated by reference herein in its entirety.

The invention claimed is:

1. An imprint apparatus for forming a pattern of an imprint material on a plurality of areas of a substrate using a mold, the imprint apparatus comprising:
   a gas supply and recover mechanism configured to supply gas from a side of the mold toward the substrate and to recover the supplied gas at the mold side;
   a substrate holding unit configured to hold the substrate, the substrate holding unit having a chuck and a plate disposed surrounding the chuck with a gap region provided between an outer circumferential side of the chuck and an inner circumferential side of the plate, with a surface height of the plate leveled with a surface of the held substrate; and
   a gas recovery mechanism, including a plurality of suction ports each facing the gap region, configured to recover the gas entrapped in the gap region through at least one of the plurality of suction ports; and
   a control unit configured to control the gas recovery mechanism,
   wherein the control unit changes a suction port, among the plurality of suction ports, for recovering the gas, in accordance with a position of an area, among the plurality of areas of the substrate, to be imprint processed.

2. The imprint apparatus according to claim 1, wherein the plurality of suction ports are disposed on at least one surface of the inner circumferential side of the plate facing to the gap region or the outer circumferential side of the chuck.

3. The imprint apparatus according to claim 2, wherein each of the plurality of suction ports is defined by one of a plurality of pipes radially arranged within the flat plate so that the plurality of pipes are oriented in a circumferential direction from the center position where the substrate is held.

4. The imprint apparatus according to claim 1, wherein, when an area, among the plurality of areas of the substrate, to be imprint processed includes an outer circumference of the substrate, the control unit controls the gas recovery mechanism to not recover the gas through one suction port, among the plurality of suction ports, facing the gap region opposed to the area including the outer circumference of the substrate.

5. The imprint apparatus according to claim 4, wherein the control unit controls the gas recovery mechanism to recover the gas through, other suction ports, among the plurality of suction ports, other than the one suction port disposed closest and adjacent to the one suction port.

6. The imprint apparatus according to claim 1, wherein the gas is pentafluoropropane.

7. An article manufacturing method comprising:
a pattern-forming step of forming, a pattern of an imprint material on a plurality of areas of a substrate using a mold of an imprint apparatus; and
a processing step of processing the substrate on which the pattern has been formed in the forming step to manufacture an article,
wherein the imprint apparatus comprises:
a gas supply and recover mechanism configured to supply gas from the a side of the mold toward the substrate and to recover the supplied gas at the mold side;
a substrate holding unit configured to hold the substrate, the substrate holding unit having a chuck and a plate disposed surrounding the chuck with a gap region provided between an outer circumferential side of the chuck and an inner circumferential side of the plate, with a surface height of the plate leveled with a surface of the held substrate; and
a gas recovery mechanism, including a plurality of suction ports each facing the gap region, configured to recover the gas entrapped in the gap region through at least one of the plurality of suction ports; and
a control unit configured to control the gas recovery mechanism,
wherein the control unit changes a suction port, among the plurality of suction ports, for recovering the gas, in accordance with a position of an area, among the plurality of areas of the substrate, to be imprint processed.

8. The imprint apparatus according to claim 1, wherein, when an area, among the plurality of areas of the substrate, to be imprint processed includes an outer circumference of the substrate, the control unit controls the gas recovery mechanism to recover the gas entrapped in the gap region through at least one of the plurality of suction ports.

9. The imprint apparatus according to claim 1, wherein the imprint apparatus applies the imprint material on the substrate with an applying unit, contacts the mold with the imprint material on the substrate, cures the imprint material while the mold and the imprint material area have been contacted, and releases the mold from the cured imprint material and supplies the gas with the gas recovery mechanism at least in part of a period from the applying to the curing.

10. The imprint apparatus according to claim 9, wherein the gas supply and recovery mechanism starts supplying gas before the mold contacts the imprint material.

* * * * *